(12) United States Patent  
Kim

(10) Patent No.: US 7,868,650 B2
(45) Date of Patent: Jan. 11, 2011

(54) TERMINATION CONTROL CIRCUIT AND METHOD FOR GLOBAL INPUT/OUTPUT LINE

(75) Inventor: Ki Up Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,266

(22) Filed: Jun. 29, 2009

(65) Prior Publication Data

US 2010/0164541 A1 Jul. 1, 2010

(30) Foreign Application Priority Data

Dec. 30, 2008 (KR) ............... 10-2008-0136384

(51) Int. Cl.
   H03K 17/16 (2006.01)
   H03K 19/003 (2006.01)
   G11C 5/14 (2006.01)

(52) U.S. Cl. .................. 326/30; 365/193; 365/226; 365/233.5

(58) Field of Classification Search .......... 326/30; 365/193, 226, 233.5
   See application file for complete search history.

(56) References Cited

U.S. PATENT DOCUMENTS

| | | | |
|---|---|---|---|
| 6,928,007 B2 * | 8/2005 | Jin | 365/194 |
| 7,019,555 B2 * | 3/2006 | Lee | 326/30 |
| 7,339,397 B2 * | 3/2008 | Lee | 326/27 |
| 7,342,412 B2 * | 3/2008 | Kim | 326/30 |
| 7,514,955 B2 * | 4/2009 | Kim | 326/30 |
| 7,525,339 B2 * | 4/2009 | Lee | 326/30 |
| 7,663,946 B2 * | 2/2010 | Kim | 365/194 |
| 2007/0222476 A1 * | 9/2007 | Lee | 326/30 |
| 2008/0100335 A1 * | 5/2008 | Choi et al. | 326/30 |
| 2008/0112252 A1 * | 5/2008 | Kim | 365/230.06 |
| 2008/0191734 A1 * | 8/2008 | Yang et al. | 326/30 |
| 2008/0204071 A1 * | 8/2008 | Lee et al. | 326/30 |
| 2008/0315916 A1 * | 12/2008 | Oh et al. | 326/30 |
| 2009/0115450 A1 * | 5/2009 | Kim et al. | 326/30 |
| 2009/0212816 A1 * | 8/2009 | Kato et al. | 326/30 |
| 2009/0224796 A1 * | 9/2009 | Heath et al. | 326/30 |

FOREIGN PATENT DOCUMENTS

| | | |
|---|---|---|
| JP | 2006-208067 | 8/2006 |
| KR | 1020050101865 | 10/2005 |
| KR | 1020060089357 | 8/2006 |

* cited by examiner

*Primary Examiner*—James H. Cho
*Assistant Examiner*—Matthew C. Tabler
(74) *Attorney, Agent, or Firm*—IP & T Group LLP

(57) ABSTRACT

A termination control circuit for a global input/output line includes a speed determination unit configured to output a termination enable signal which is activated in response to a frequency of an external clock signal and CAS latency information; and a pulse generation unit configured to output a driving signal for driving a termination circuit for the global input/output line in response to a termination control signal and the termination enable signal.

5 Claims, 3 Drawing Sheets

TERMINATION CONTROL CIRCUIT AND METHOD FOR GLOBAL INPUT/OUTPUT LINE

CROSS-REFERENCES TO RELATED PATENT APPLICATION

The present application claims priority under 35 U.S.C 119(a) to Korean Application No. 10-2008-0136384, filed on Dec. 30, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a termination control circuit and a termination control method for a global input/output line.

2. Related Art

A semiconductor memory apparatus is desired to operate at a high frequency, a high speed, and a low voltage. The speed of the semiconductor memory apparatus depends on a data access time (tAA). The data access time means a time until a first datum is outputted after a read command is inputted.

It is important to reduce a state transition time of a global input/output line GIO and a coupling noise in order to decrease the data access time. For this, a GIO termination circuit is used.

FIG. 1 is a block diagram of a known semiconductor memory apparatus and illustrates some of constituent members for outputting data by the read command.

Data 'IN' read from a memory cell by a column selection signal are inputted into a read driver 10 through a local input/output line LIO. Further, the data 'IN' are transmitted to a receiver 14 through a global input/output (GIO) line and output data 'OUT' of the receiver 14 are outputted through a data pad (not shown). At this time, a GIO termination circuit 12 is provided in each GIO line in order to shorten a transition time of the GIO line. Further, the GIO line is precharged by driving the GIO termination circuit 12 with a termination control signal 'WTS' that is enabled response to the read command.

FIG. 2 is a circuit diagram of the semiconductor memory apparatus of FIG. 1.

First, the read driver 10 is constituted by an inverter that is connected between a power supply voltage terminal VDD and a ground terminal VSS to receive and inversely output the data 'IN'. Herein, the inverter can be configured by connecting a first PMOS transistor P11 and a first NMOS transistor N11 in series.

The GIO termination circuit 12 can be configured to include a second PMOS transistor P12 of which a source terminal is connected to the power supply voltage terminal VDD and a gate terminal is applied with the termination control signal 'WTS', a third PMOS transistor P13 of which a source terminal is connected to a drain terminal of the second PMOS transistor P12, and a gate terminal and a drain terminal are commonly connected, and a first resistance element R11 that is connected between the drain terminal of the third PMOS transistor P13 and an output terminal of the read driver 10.

In addition, the GIO termination circuit 12 can be configured to include a third NMOS transistor N13 of which a gate terminal is applied with an inversion signal of the termination control signal 'WTS' and a source terminal is connected to the ground terminal VSS, a second NMOS transistor N12 of which a source terminal is connected to a drain terminal of the third NMOS transistor N13, and a drain terminal and a gate terminal are commonly connected, and a second resistance element R12 that is connected between the drain terminal of the second NMOS transistor N12 and the output terminal of the read driver 10.

Moreover, the receiver 14 is constituted by an inverter that is connected between the power supply voltage terminal VDD and the ground terminal VSS to generate the output data OUT by inverting an output signal of the read driver 10. Herein, the inverter can be configured by a fourth PMOS transistor P14 and a fourth NMOS transistor N14 that are connected between the power supply voltage terminal VDD and the ground terminal VSS in series.

The termination control signal 'WTS' has a logically high state in a write command and a logically low state in the read command. The termination control signal WTS controls on/off states of the GIO termination circuit 12.

When the read command is generated, the termination control signal WTS is transitioned to a low level. The second PMOS transistor P12 and the third PMOS transistor P13 are turned on to precharge the GIO line before the input data 'IN' are transmitted to the GIO line.

As such, by driving the GIO termination circuit 12 to reduce a swing width of the GIO line in a read operation, a signal can be transmitted at a high speed and the coupling noise of adjacent GIO lines can be reduced. On the contrary, unnecessary current consumption is prevented by turning off the GIO termination circuit 12 in a write operation.

However, the GIO termination circuit 12 must be provided in each GIO line. For example, a semiconductor memory apparatus operating at a speed of ×16 uses 64 GIO lines and thus needs 64 GIO termination circuits.

In the GIO termination circuit 12 shown in FIG. 2, a current path is formed by the second PMOS transistor P12, the third PMOS transistor P13, and the first NMOS transistor N11 in the read operation. A current used in the GIO termination circuit 12 increases in proportion to the number of GIO termination circuits 12.

As a result, an active-read-precharge current IDD1 and a burst-read current IDD4R increase, such that power consumption increases.

SUMMARY

A termination control circuit and a termination control method for a global input/output line that can determine termination or not of the global input/output line depending on an operation speed of the semiconductor memory apparatus are disclosed herein.

A termination control circuit and a termination control method for a global input/output line that can prevent unnecessary current consumption by turning off a termination circuit for the global input/output line in a semiconductor memory apparatus that does not operate at a certain speed are also disclosed herein.

In one aspect, a termination control circuit for a global input/output line includes a speed determination unit configured to output a termination enable signal which is activated in response to a frequency of an external clock signal and CAS latency information; and a pulse generation unit configured to output a driving signal for driving a termination circuit for the global input/output line in response to a termination control signal and the termination enable signal.

In another aspect, a termination control method for a global input/output line includes determining whether or not a frequency of an external clock signal and CAS latency information satisfy a certain combination in response to receipt of the external clock signal and the CAS latency information are inputted; and outputting a driving signal for driving a termination circuit for a global input/output line when the frequency of the external clock signal and the CAS latency information satisfy the certain combination.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 3:
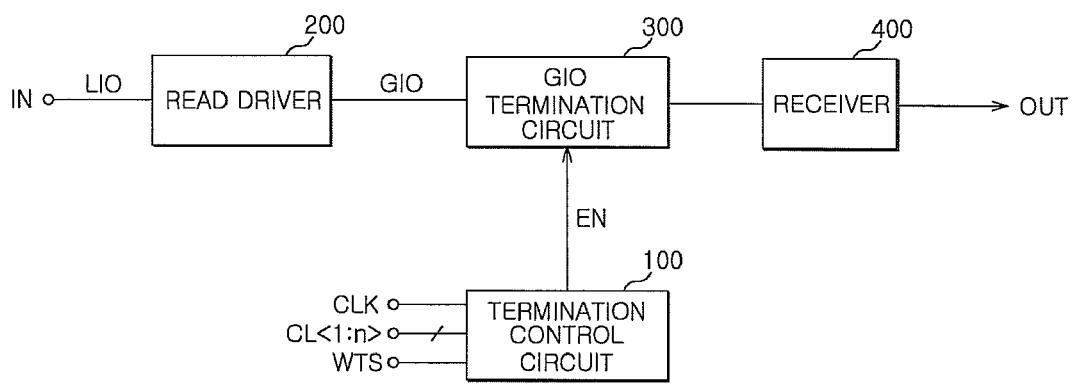
FIG. 3 is a block diagram of an exemplary semiconductor memory apparatus with a termination control circuit according to one embodiment.

FIG. 3 is a block diagram of an exemplary semiconductor memory apparatus with a termination control circuit according to one embodiment. In particular, FIG. 3 illustrates exemplary constituent members for outputting data by a read command.

As shown in the figure, the semiconductor memory apparatus can include a termination control circuit 100, a read driver 200, a GIO termination circuit 300, and a receiver 400.

First, the termination control circuit 100 can determine an operation speed of the semiconductor memory apparatus in accordance with a frequency of an external clock signal 'CLK' and CAS latency (CL) information 'CL<1:n>'. Further, when a certain speed is satisfied, the termination control circuit 100 can output a driving signal 'EN' for turning on the GIO termination circuit 300 in response to a termination control signal 'WTS'.

The read driver 200 receives data 'IN' read from a memory cell through an LIO line in accordance with a read command.

Meanwhile, the GIO termination circuit 300 is driven by the driving signal 'EN' to precharge the GIO line before the data are outputted from the read driver 200.

Moreover, the receiver 400 can receive the data transmitted through the GIO line and generate output data 'OUT'.

Figure 1:
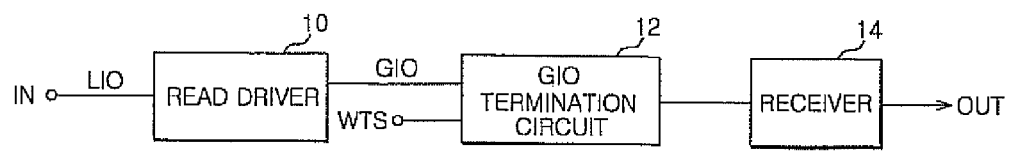
FIG. 1 is a block diagram of a conventional semiconductor memory apparatus.
Figure 2:
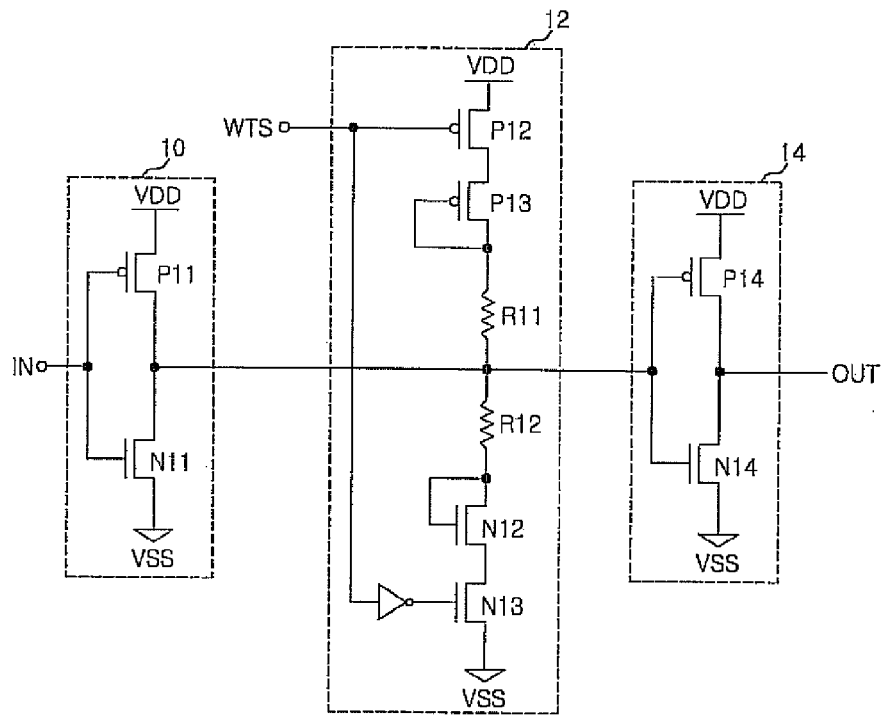
FIG. 2 is a circuit diagram of the semiconductor memory apparatus of FIG. 1.

Herein, the GIO termination circuit 300 may be configured according to an example shown in FIG. 2, but is not limited thereto.

Hereinafter, the termination control circuit 100 will be described below in detail. The termination control circuit 100 can detect a frequency by receiving the external clock signal 'CLK' and determine whether or not the operation speed of the semiconductor memory apparatus satisfies the certain speed by combining information on the detected frequency with the CAS latency information given from a mode register set (MRS).

A data access time (tAA) for determining the operation speed of the semiconductor memory apparatus is acquired by multiplying the CAS latency by the clock signal frequency.

For example, when the clock signal frequency is 400 MHz, one cycle is 2.5 ns and when the CAS latency (CL) is 5, the data access time (tAA) is 2.5 ns×5=12.5 ns.

Therefore, in the present invention, a combination of the external clock signal frequency and the CAS latency are previously determined in order to drive the GIO termination circuit 300. When a combination of the external clock signal frequency and the CAS latency information received from the MRS satisfies the certain combination, the GIO termination circuit 300 is driven.

That is, the external clock signal frequency is detected and at this time, when the CAS latency (CL) information acquired from the MRS is inputted as a value satisfying a condition for a high-speed operation of the semiconductor memory apparatus, the termination control circuit 100 outputs the driving signal 'EN' for turning on the GIO termination circuit 300.

Figure 4:
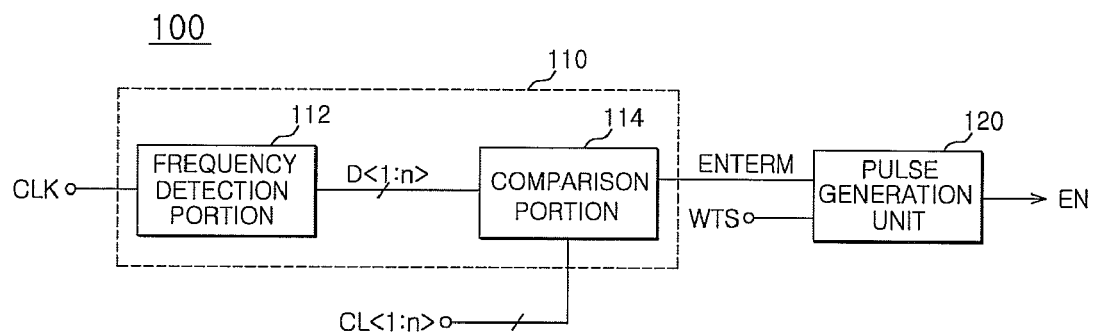
FIG. 4 is a configuration diagram of an exemplary termination control circuit of FIG. 3 according to one embodiment.

FIG. 4 is a configuration diagram of an exemplary termination control circuit of FIG. 3 according to one embodiment.

In FIG. 4, the termination control circuit 100 can include a speed determination unit 110 and a pulse generation unit 120.

The speed determination unit 110 can determine whether or not the semiconductor memory apparatus operates at a high speed in response to the external clock signal 'CLK' and the CAS latency (CL) information. Further, when it is determined that the semiconductor memory apparatus operates at the high speed, a termination enable signal 'ENTERM' is activated.

For this, the speed determination unit 110 can include a frequency detection portion 112 and a comparison portion 114.

First, the frequency detection portion 112 receives the external clock signal 'CLK' and detects the frequency of the external clock signal 'CLK' to output an n-bit frequency detection signal 'D<1:n>'. Herein, the frequency detection signal 'D<1:n>' has a high level in only one bit thereof in accordance with a frequency detection result. For example, n may be 3, and a first frequency detection signal 'D<1>' when the frequency is 533 MHz, a second frequency detection signal 'D<2>' when the frequency is 400 MHz, and a third frequency detection signal 'D<3>' when the frequency 333 MHz may be outputted at a high level.

Herein, the frequency detection portion 112 may be configured in various forms. For example, when a reference clock is set, the frequency detection portion 112 counts the number of cycles which the external clock signal 'CLK' has for one cycle of the reference clock signal and outputs the frequency detection signal by decoding the result.

Next, the comparison portion 114 can activate the terminal enable signal 'ENTERM' by receiving a frequency detection signal 'D<1:n>', which is outputted from the frequency detection portion 112 and CAS latency information 'CL<1:n>', which is given from the MRS. At this time, the comparison portion 114 can activate the termination enable signal 'ENTERM' when it is determined that the semiconductor memory apparatus operates at the high speed in accordance with the combination of the frequency of the external clock signal and the CAS latency (CL) configured to satisfy the condition for the high-speed operation of the semiconductor memory apparatus.

Meanwhile, the pulse generation unit 120 can output the driving signal 'EN' for controlling on/off states of the GIO termination circuit 300 by receiving the termination enable signal 'ENTERM' and the termination control signal 'WTS'.

Figure 5:
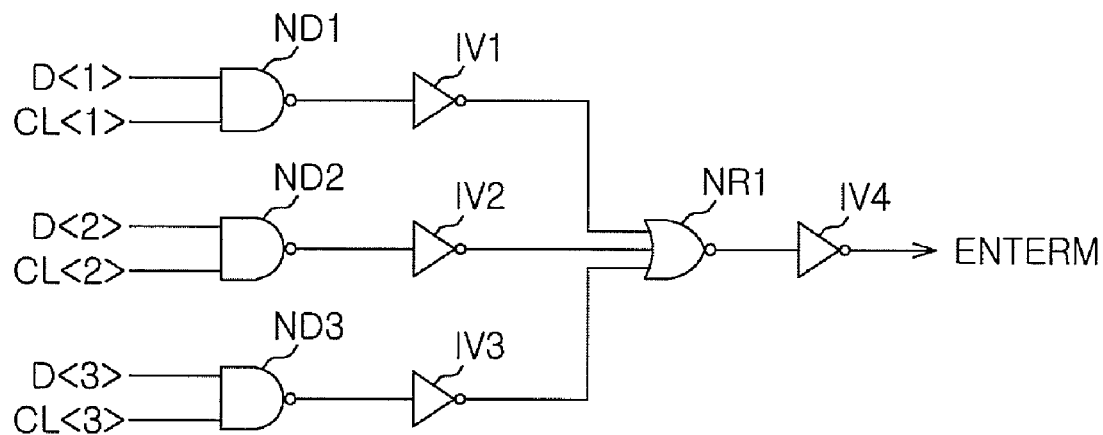
FIG. 5 is a circuit diagram of an exemplary comparison portion of FIG. 4 according to one embodiment.

FIG. 5 is a circuit diagram of an exemplary comparison portion of FIG. 4 according to one embodiment.

In regard to a condition for driving the GIO termination circuit 300, that is, the certain combination of the external clock signal frequency of the semiconductor memory apparatus and the CAS latency (CL), the comparison portion 114 can determine whether or not the semiconductor memory apparatus satisfies the certain combination by comparing the CAS latency (CL) information acquired from the MRS with the frequency detected from the frequency detection portion 112.

For this, the comparison portion 114 can include a plurality of NAND gates ND1 to ND3 that each receives a bit of the frequency detection signal 'D<1:n>' and a bit of the CAS latency information 'CL<1:n>', a plurality of inverters IV1 to IV3 that are connected to output terminals of the NAND gates ND1 to ND3, and logical elements NR1 and IV4 that combine signals outputted from the plurality of inverters IV1 to IV3.

More specifically, the first NAND gate ND1 can receive the first frequency detection signal 'D<1>' and first CAS latency information 'CL<1>' and the first inverter IV1 can invert an output signal of the first NAND gate ND1. The second NAND gate ND2 can receive the second frequency detection signal 'D<2>' and second CAS latency information 'CL<2>' and the second inverter IV2 can invert an output signal of the second NAND gate ND2. Moreover, the third NAND gate ND3 can receive the third frequency detection signal 'D<3>' and third CAS latency information 'CL<3>' and the third inverter IV3 can invert an output signal of the third NAND gate ND3.

A NOR gate NR1 constituting the logical element can receive output signals of the first to third inverters IV1, IV2, and IV3. The fourth inverter IV4 can output the termination enable signal 'ENTERM' by inverting an output signal of the NOR gate NR1.

The comparison portion 114 shown in FIG. 5 receives the 3-bit frequency detection signal 'D<1:3>' and the 3-bit CAS latency information 'CL<1:3>', but is not limited thereto.

Any one of the frequency detection signals 'D<1:n>' is outputted at a high level by the frequency detection portion 112 and any one of the CAS latency information 'CL<1:n>' is inputted at a high level by the CAS latency (CL) acquired from the MRS.

The comparison portion 114 can output the termination enable signal 'ENTERM' at a high level when any one frequency detection signal is inputted at a high level and the CAS latency information acquired from the MRS satisfies the certain combination of the external clock signal frequency and the CAS latency (CL) information.

For example, when the external clock signal frequency is 533 MHz, the first frequency detection signal 'D<1>' is outputted at a high level. In this case, when the first CAS latency information 'CL<1>' indicating that the CAS latency 6 is at a high level, it is determined that the semiconductor memory apparatus operates at the high speed.

Similarly, when the external clock signal frequency is 400 MHz, the second frequency detection signal 'D<2>' is outputted at a high level. In this case, when the second CAS latency information 'CL<2>' indicating that the CAS latency 5 is at a high level, it is determined that the semiconductor memory apparatus operates at the high speed. Further, when the external clock signal frequency is 333 MHz, the third frequency detection signal 'D<3>' is outputted at a high level. In this case, when the third CAS latency information 'CL<3>' indicating that the CAS latency 4 is at a high level, it is determined that the semiconductor memory apparatus operates at the high speed.

That is, when the combination of the external clock signal frequency and the CAS latency information satisfies the certain combination, the termination enable signal 'ENTERM' is outputted at a high level.

Figure 6:
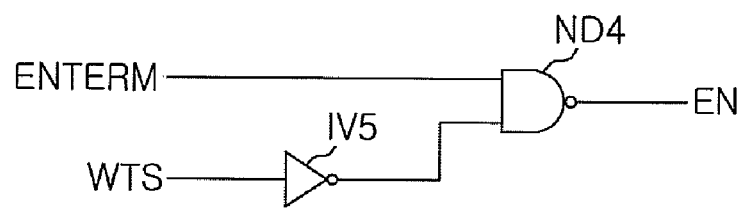
FIG. 6 is a configuration diagram of an exemplary pulse generation unit of FIG. 4 according to one embodiment.

FIG. 6 is a configuration diagram of an exemplary pulse generation unit of FIG. 4 according to one embodiment.

The pulse generation unit 120 can include a fourth NAND gate ND4 that can output the driving signal 'EN' by receiving the termination enable signal 'ENTERM' generated by the comparison portion 114 and a termination control signal '/WTS' inverted by a fifth inverter IV5.

When the combination of the external clock signal frequency of the semiconductor memory apparatus and the CAS latency (CL) satisfies the certain combination, such that it is determined that the semiconductor memory apparatus operates at the high speed, the terminal enable signal 'ENTERM' is outputted at a high level and when the termination control signal 'WTS' is at a low level by the read operation, the fourth NAND gate ND4 can turn on the GIO termination circuit 300 by outputting the driving signal 'EN' having the low level.

On the contrary, when the combination of the external clock signal frequency of the semiconductor memory apparatus and the CAS latency (CL) does not satisfy the certain combination, the termination enable signal 'ENTERM' is outputted at a low level. In this case, even though the termination control signal 'WTS' is at a low level, the driving signal 'EN' is at a high level, such that the GIO termination circuit 300 is turned off.

According to the present invention, it is possible to prevent unnecessary current consumption by driving a GIO termination circuit 300 only when a combination of an external clock signal frequency of the semiconductor memory apparatus and CAS latency (CL) satisfies a certain combination by considering the external clock signal frequency and the CAS latency.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A termination control circuit for a global input/output line, comprising:
   a speed determination unit configured to output a termination enable signal which is activated in response to a frequency of an external clock signal and CAS (Column Access Strobe) latency information having at least 1 bit; and
   a pulse generation unit configured to output a driving signal for turning on or off a termination circuit for the global input/output line in response to a termination control signal and the termination enable signal,
   wherein the speed determination unit includes:
      a frequency detection portion configured to detect the frequency of the external clock signal and output a frequency detection signal having at least 1 bit in response to the detection; and
      a comparison portion configured to receive the frequency detection signal and the CAS latency information and output the termination enable signal in response to the receipt of the frequency detection signal and the CAS latency information, and
   wherein at least one bit of the frequency detection signal indicates whether the external clock signal has a corresponding frequency or not.

2. The termination control circuit of claim 1, wherein the comparison portion enables the termination enable signal when the frequency of the external clock signal and the CAS latency information form a combination that enables the turning on of the termination circuit.

3. The termination control circuit of claim 1, wherein the comparison portion includes:
   a plurality of first logical elements each configured to receive a bit of the frequency detection signal and a bit of the CAS latency information;
   a plurality of inverters connected to output terminals of the plurality of first logical elements;
   a second logical element configured to receive signals outputted from the plurality of inverters; and
   an inverter configured to output the termination enable signal by inverting an output signal of the second logical element.

4. The termination control circuit of claim 1, wherein the pulse generation unit includes a third logical element configured to output the driving signal by receiving the termination enable signal and an inversion signal of the termination control signal.

5. A termination control method for a global input/output line, comprising:
   determining whether or not a frequency of an external clock signal and CAS Column Access Strobe) latency information form a combination that enables driving of a termination circuit in response to receipt of the external clock signal and the CAS latency information; and
   outputting the driving signal for driving the termination circuit for a global input/output line when the frequency of the external clock signal and the CAS latency information form the combination that enables driving of a termination circuit,
wherein determining whether or not the frequency of the external clock signal and the CAS latency information form a combination that enables driving of a termination circuit includes:
   detecting the frequency of the external clock signal to output a frequency detection signal; and
   logically combining CAS latency information with the frequency detection signal, and
wherein detecting the frequency of the external clock signal includes generating the frequency detection signal having at least one bit that indicates whether the external clock signal has a corresponding frequency or not.

* * * * *